United States Patent [19]

Stewart

[11] 4,339,809
[45] Jul. 13, 1982

[54] NOISE PROTECTION CIRCUITS

[75] Inventor: Roger G. Stewart, Neshanic Station, N.J.

[73] Assignee: RCA Corporation, New York, N.Y.

[21] Appl. No.: 188,887

[22] Filed: Sep. 19, 1980

[51] Int. Cl.³ .............................................. G11C 11/40
[52] U.S. Cl. .................................... 365/206; 365/208
[58] Field of Search .............. 365/206, 207, 208, 209, 365/210

[56] References Cited
U.S. PATENT DOCUMENTS
3,651,468 3/1972 Waaben .............................. 365/206

Primary Examiner—Terrell W. Fears
Attorney, Agent, or Firm—Samuel Cohen; Henry I. Schanzer

[57] ABSTRACT

An integrated circuit (IC) such as a memory array is connected via a normally closed switch to a power supply. The switch is opened to isolate the IC (memory array) from the power supply during the time intervals that the IC (memory array) is vulnerable to noise transients that may be present on the power supply lines.

19 Claims, 3 Drawing Figures

NOISE PROTECTION CIRCUITS

This invention relates to circuits for protection against noise.

Some known electronic systems are continuously protected against input transients even though the systems are not always vulnerable to being disturbed. The protection ciruit consumes power and as the protection is only needed some of the time part of the power is wasted. Also, known protection systems normally use low pass filters to block transients while allowing the flow of direct current (DC) supply current. Such systems are expensive in that they require external components such as inductors, large capacitors, and/or shielded boxes.

In contrast thereto, a protective system embodying the invention includes a circuit which locks out external signals and power sources during periods when the system is most vulnerable to being disturbed. In a particular example, memory arrays are extremely noise sensitive when information is being read out of the memory cell onto a sense amplifier. Noise transients occurring during the read out interval may mask or alter the information being read out. Therefore, in memory arrays embodying the invention, the memory array is isolated from the power supply during read out.

In the accompanying drawing in which like reference characters denote like components:

Figure 1:
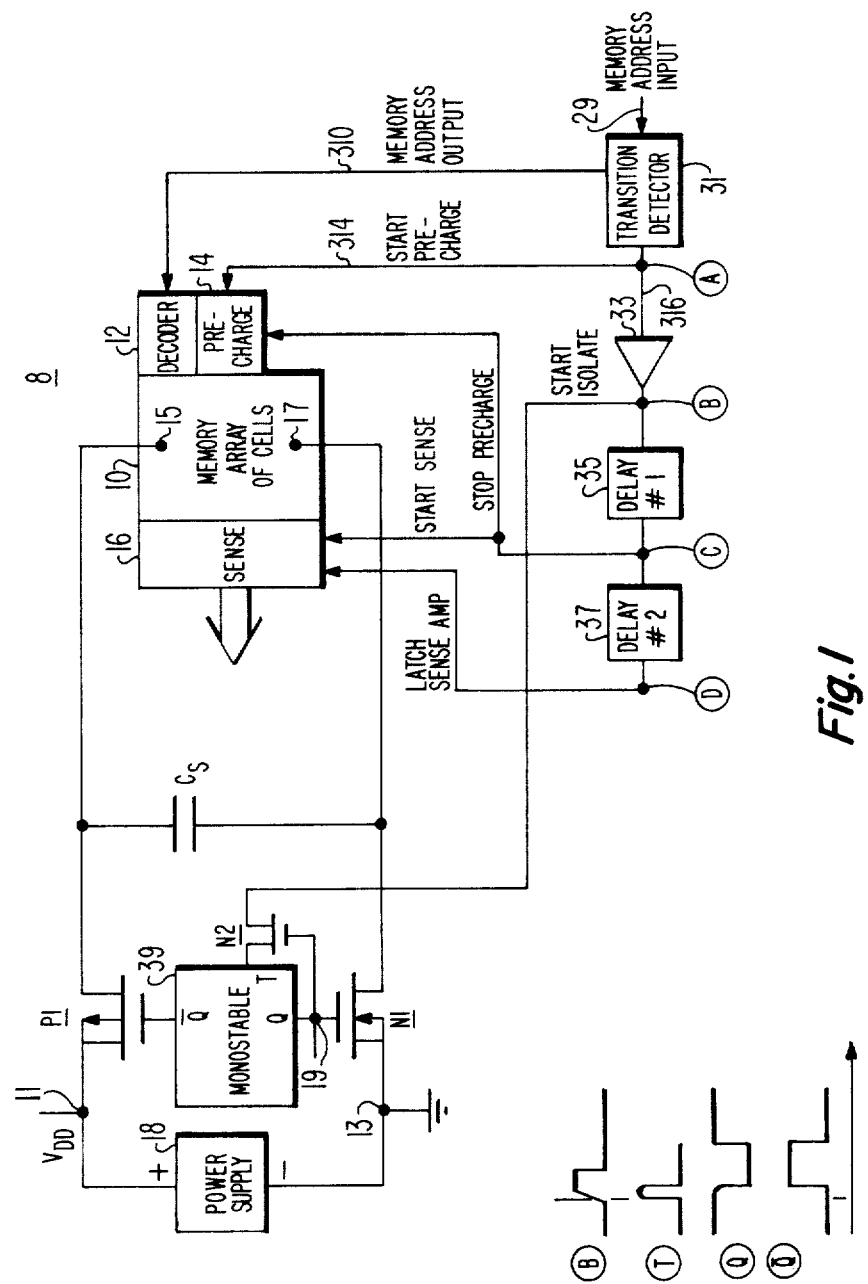
FIG. 1 is a partial block, partial schematic diagram of a system embodying the invention.

The circuit of FIG. 1 includes a memory 8 which may be any one of a number of known Random Access Memories (RAMs) or Read Only Memories (ROMs). RAMs and ROMs may take many forms as illustrated, for example, in U.S. Pat. Nos. 4,208,730, 4,189,782, 4,156,940, 4,107,556, 4,044,341, 4,063,225, and 4,075,690. The structure and operation of RAMS and ROMS are well known and need not be described in detail in this application. Suffice it to say that these memories are capable of storing information and that the stored information is selectively read out of the array. Memory arrays are particularly susceptible to noise signals on the power supply line during the time information is being read out from the memory cells into the sensing circuitry. As described below, in the present invention it is during this (sense or read) period that the memory array isolates itself from the power supply lines.

Memory 8 includes an array 10 of memory cells, a decoder 12, a precharge circuit 14, and a sense circuit 16. The cells of the array 10 are selected (accessed) for read (or write) by means of word lines (not shown in detail) connected to decoder 12. The information contained in selected cells is read out onto bit lines (not shown in detail) connected to sense amplifiers (not shown) in sense circuit 16. The bit lines are selectively precharged, prior to read out, by means of a precharge circuit 14. Memory 8 has a first power terminal 15 to which is normally applied a first operating potential and a second power terminal 17 to which is applied a second operating potential which is negative with respect to the potential applied to terminal 15. The voltages at terminals 17 and 15 are distributed to the component parts (10, 12, 14, and 16) of the memory 8 and to the control circuitry described below.

A storage capacitor $C_S$ is connected between terminals 15 and 17. $C_S$ represents any discrete capacitance connected between terminals 15 and 17 and all the distributed capacitance associated with memory 8 and the other peripheral circuits connected between terminals 15 and 17. $C_S$ functions as the energy storage source for the system during the period that power is removed from the memory array. The value of $C_S$ to maintain a given voltage across the array, after the removal of the external power supply, may be calculated as discussed below.

A power supply 18 supplies a positive output $V_{DD}$ to a first power terminal 11 and is connected to a reference voltage source at its negative output terminal 13. The reference voltage may be ground, as shown, but it may instead be some other value so long as the potential difference between terminals 11 and 13 is of the correct polarity and of sufficient amplitude to operate the circuit. The source-to-drain path of a power switching transistor P1 is connected between terminals 15 and 11. The source-to-drain path of a power switching transistor N1 is connected between terminals 17 and 13. The gate electrode of N1 is connected to a node 19 to which is connected the Q output of a monostable multivibrator 39 and the gate electrode of P1 is connected to the $\bar{Q}$ output of the monostable multivibrator 39. The monostable multivibrator 39 may be any one of a number of known multivibrators having two outputs (Q and $\bar{Q}$). The Q output is normally high ($V_{DD}$) and the $\bar{Q}$ output is normally low (ground). Consequently, P1 and N1 are normally turned-on. The monostable has a trigger input (T) which when driven high causes the Q output to be driven low (to ground) and the $\bar{Q}$ output to be driven high (to $V_{DD}$) for a predetermined time period. Transistors P1 and N1 are turned-off concurrently when the trigger input goes high and, subsequently, are turned-on concurrently after the disappearance of the trigger input, as discussed below. When turned-on, P1 and N1 conduct in the common source mode and provide a very low impedance conduction path between terminals 11 and 15 and terminals 13 and 17, respectively, and each functions as a closed switch. When turned-off, P1 and N1 provide a very high impedance path and function as open switches.

The read operation of memory 8 is initiated by means of memory address inputs applied to transition detectors. There is normally one transition detector per memory address input. For ease of discussion FIG. 1 shows a single memory address input line 29 connected to a transition detector 31.

In general, the transition detector senses changes in the memory address input data and in response thereto signals the memory and associated circuitry that information is going to be read out of the memory, (or that information is going to be written into the memory), and that certain housekeeping functions, such as precharge, must be taken care of. The information on the memory address input is also decoded and determines which bit or word of the array 10 will be read (or have information written into it). In FIG. 1 transition detector 31 couples a memory address output signal, corresponding to the memory address input signal at 29, onto line 310 which is connected to decoder 12. Decoder 12 decodes the memory address output signals at its input and produces a decoded output which determines which bit or word of the memory array 10 will be readout or sensed. Transition detector 31 may be any one of a number of known detectors and may be, for example, similar to circuits shown and disclosed in U.S. Pat. No. 4,039,858 issued Aug. 2, 1977 to Roger G. Stewart.

Figure 3:
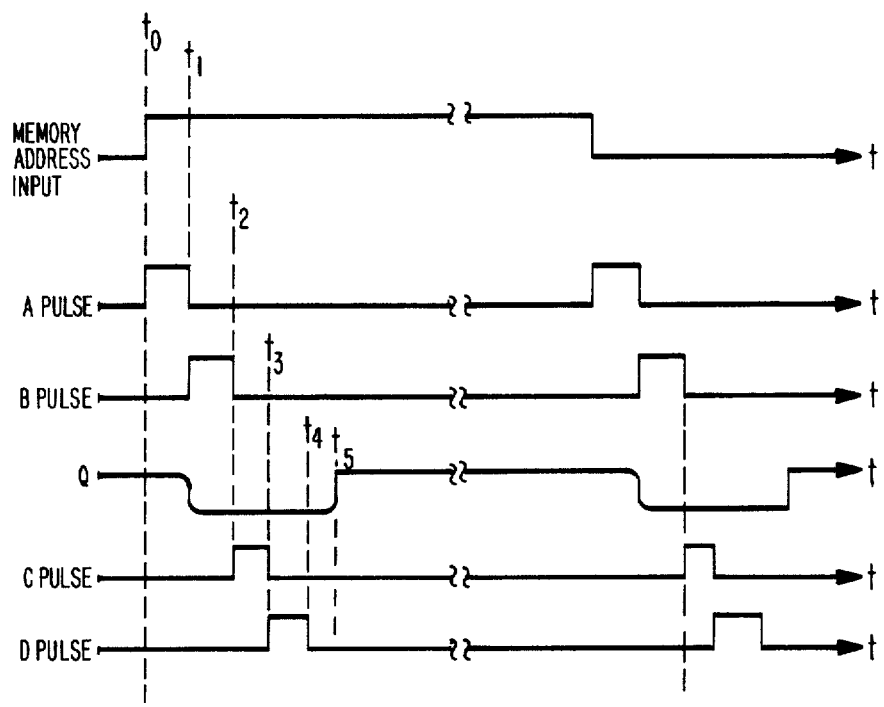
FIG. 3 is a diagram of waveforms at various points of the circuit of FIG. 1.

The transition detector 31 has a second output "A" at which an A-pulse, as shown in FIG. 3, is produced each time the memory address input signal makes a transition from one level to another. The A-pulse is applied via line 314 to precharge circuit 14 to initiate the precharging of the bit lines and sense circuits 16 of memory 8. This sets the memory in a condition where readout can occur quickly and without disturbing the stored information. Concurrently, the A-pulse is applied via line 316 to the input of a buffer 33 which functions both as a buffer and as a delay network. Buffer 33 produces a positive going output (B-pulse as shown in FIG. 3) in response to the A-pulse. The output of buffer 33 is connected via the source-drain path of a selectively enabled transmission gate switch transistor N2 to the trigger input of monostable multivibrator 39. The gate of N2 is connected to node 19 whereby N2 is turned-off and on together with transistor N1. The advantage of this connection is that the signal line from the output of Buffer 33 to the multivibrator 39 is broken (i.e. N2 behaves like a very high impedance) when the memory system 8 is decoupled from the external power supply 18. When N2 is ON, a positive going B-pulse is coupled via N2 to the T input and causes the T input to be driven high. This, in turn, causes the Q output to go low, as shown in FIG. 3, and the $\bar{Q}$ output to go high. When Q goes low, transistor N1 is turned off and node 13 is electrically isolated from terminal 17. Concurrently, Q-goes high and transistor P1 is turned-off, electrically isolating terminal 11 from terminal 15. Thus, starting with the generation of the positive going B-pulse the memory 8 is isolated from the power supply lines. Power supply noise no longer affects the operation of the memory 8.

The output of buffer 33 is also applied to the input of a delay network 35. Network 35 provides a delay which is sufficiently long to enable the bit lines and the sense amplifiers to be precharged to a desired level. Network 35 produces an output (C-pulse, as shown in FIG. 3) which is applied to precharge circuit 14 to interrupt and stop the precharge and to sense circuit 16 to initiate the readout of data from selected memory cells onto the sense amplifiers. The output of network 35 is also applied to the input of a delay network 37. Network 37 provides an interval of time which is sufficiently long to enable the accurate and full transfer of data from the selected cells to the sense amplifiers in sense circuit 16. At the end of the delay interval, network 37 produces an output (D-pulse, as shown in FIG. 3) which is applied to the sense circuit 16. The D-pulse to sense circuit 16 causes the sense amplifiers in circuit 16 to latch-up in a state corresponding to the data readout from their respective memory cells.

The monostable period is set such that the Q output goes high and the $\bar{Q}$ output goes low after the generation of the D pulse, as shown in FIG. 3. Q-high causes N1 to be turned-on and terminal 13 and 17 to be tightly coupled. $\bar{Q}$-low causes P1 to be turned on and terminals 11 and 13 to be tightly coupled. Thus, after the generation of the D-pulse the memory 8 is again coupled to power supply 18. Memory 8 was decoupled from the power supply 18 during the readout and sensing period. Thus, the memory is protected against spurious noise transients on the power supply lines during the period of time that it is most susceptible to noise.

During the time the memory 8 is decoupled from the power supply, capacitor $C_S$ supplies the required energy to the system. The voltage drop across $C_S$ during a typical isolation cycle may be calculated. In a typical example, $C_S$, which represents the total capacitance connected between terminals 15 and 17, may be equal to 1000 picofards. In a 4K RAM suitable for use in the system of FIG. 1 the current (I) drawn by the RAM during the sense period is approximately 5 milliamperes. The duration ($\Delta T$) of the sense period is, for example, 20 nanoseconds. Therefore, the voltage drop ($\Delta V$) between terminals 15 and 17 during the sense period may be calculated at follows: $\Delta V = \Delta T \times I/C_S = 20 \times 10^{-9} \times 0.005/10^{-9}$. Therefore, $\Delta V = 0.1$ volt. Assume that, just prior to isolation from power supply 18, the voltage between terminals 15 and 17 was $+5$ volts. This voltage would drop to 4.9 volts during the isolation period. This degree of voltage drop is permissible in most circuit applications. The important thing is that during the isolation interval any noise on the $V_{DD}$ and ground lines do not get coupled into the memory.

In the system of FIG. 1 the isolation of the memory array from the power supply is controlled by circuitry which is internal to the memory system. It is the system which determines its vulnerability and isolates itself; the controls are not external to the memory system. Although the power supply is disconnected from the memory array the memory array remains powered. The storage capacitor $C_S$ provides the necessary energy storage for the array. Therefore, all the circuitry in the system of FIG. 1 remains fully functional even while the memory array is disconnected from the power supply. Disconnecting the power supply from the circuit is done to prevent faults due to transient noise signals. This should not be confused with those applications where the power lines are decoupled or the power to the load is decreased to save power consumption by the load system. Thus, in systems embodying the invention power is saved in that power consuming filters are not necessary. Filtering is accomplished by disconnecting the system from the power supply 18. Of course, sufficient energy storage means such as capacitor $C_S$ which may be of discrete or distributed form must be present during the decoupled period to ensure proper operation of the system.

In the circuit of FIG. 1 a monostable 39 was used to control the turn-on and turn-off of P1 and N1. It should be evident that other circuit arrangements could be used instead to control the switching of the power line transistors. For example, the circuit could include a set-reset flip-flop which could be set by the B-pulse and reset by the D-pulse.

Figure 2:
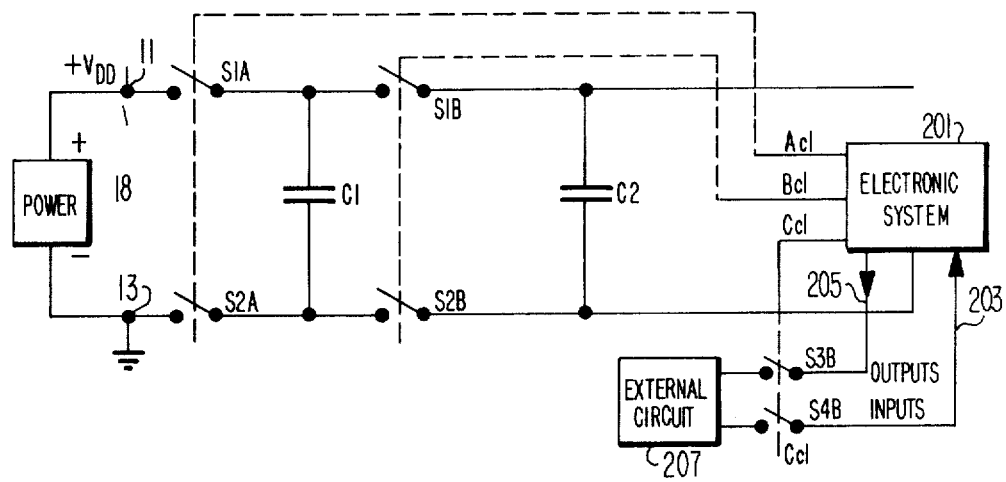
FIG. 2 is a block diagram of another system embodying the invention.

The circuit of FIG. 2 illustrates a system in which the electronic system 201 is always decoupled from the main power supply 18. During one time interval (T1), an A-clock, generated by system 201, goes high causing switches S1A and S2A to be closed and capacitor C1 to be charged to $V_{DD}$ volts. During T1, when switches S1A and S2A are closed, switches S1B and S2B are held open by means of a B-clock also generated by system 201. During the T1-time interval, S1B and S2B are open, a capacitor C2 supplies the energy to maintain the system 201 fully operational. When C1 is charged to the power supply voltage, or at some time determined by the system, switches S1A and S2A are opened and switches S1B and S2B are closed by means of the B-clock. The charge on C1 is then redistributed between capacitors C1 and C2 and the resultant voltage is applied across the system. Thus, in this arrangement the electronic system 201 is always isolated from the power supply. As to the circuit of FIG. 2 it is evident that the electronic system can be isolated at all times without the use of clocks and resistors. By judicious selection of the ratio of C1 and C2 power supply transients are significantly attenuated when energy is transferred from C1 to C2. By making C2 (e.g. 1 microfarad) much larger than C1 (e.g. 1000 picofarad) large variations in the voltage applied to C1 will be reduced by the ratio of C1 to C2 when C1 is first decoupled from the power supply 18 and then coupled across C2.

Signal inputs 203 to the system and signal outputs 205 from the system may also be selectively decoupled from an external circuit 207, during conditions which are disruptive to the system. Thus, in FIG. 2, the inputs 203 are coupled via a switch S4B to circuit 207 and the outputs 205 are coupled via a switch S3B to circuit 207. The switches are then controlled by a C-clock signal produced by the electronic system 201.

To achieve the highest level of isolation, the circuits of FIGS. 1 and 2 show a power switch connected in each of the power lines. That is, a switch (e.g. P1) in the $V_{DD}$ line, and the switch (e.g. N1) in the ground return line. It should be appreciated, however, that a high degree of isolation can be achieved by decoupling just one of the two power lines to the system.

What is claimed is:

1. The combination comprising:
   first and second power terminals for the application therebetween of an external operating potential;
   an electronic system having first and second points for the application therebetween of the operating potential for the system, said system having an operating cycle during which said system is particularly sensitive to noise signals;
   means connecting a first switch means between said first power terminal and said first point;
   means connecting said second point to said second power terminal; and
   means, responsive to the initiation of said operating cycle coupled to said first switch means for opening said switch means and electrically disconnecting said first point from said first power terminal during said operating cycle.

2. The combination as claimed in claim 1 wherein said first switch means includes a first transistor having a conduction path and a control electrode; wherein said conduction path is connected between said first power terminal and said first point; and wherein said control electrode is connected to said means responsive to the initiation of said operating cycle.

3. The combination as claimed in claim 2 wherein said means connecting said second point to said second power terminal includes a second switch means comprising a second transistor having a conduction path and a control electrode, wherein said conduction path of said second transistor is connected between said second power terminal and said second point; and wherein said control electrode of said second transistor is connected to said means responsive to the initiation of said operating cycle, for being turned on and off concurrently with the turn on and turn off of said first transistor.

4. The combination as claimed in claim 1 wherein said first switch means includes first and second switches connected in series between said first power terminal and said first point, said first switch being connected between said first power terminal and a first intermediate point and said second switch being connected between said first intermediate point and said first point; and wherein said means responsive to the initiation of said operating cycle includes means coupled to said first and second switches for opening said second switch during said operating cycle and closing said first switch, and subsequently closing said second switch and opening said first switch.

5. The combination as claimed in claim 4 wherein said means connecting said second point to said second power terminal includes third and fourth switches connected in series between said second power terminal and said second point, said third switch being connected between said second power terminal and a second intermediate point and said fourth switch being connected between said second intermediate point and said second point; and wherein said means responsive to the initiation of said operating cycle includes means coupled to said third and fourth switches for turning said third switch on and off concurrently with the turn-on and turn-off of said first switch and for turning said fourth switch on and off concurrently with the turn on and turn off of said second switch.

6. The combination comprising:
   first and second power terminals for the application therebetween of an external operating potential;
   a memory array having first and second points for the application therebetween of the operating potential for the array, said memory array having a read cycle during which information contained in the memory array is read out to sense circuitry, said memory array being particularly sensitive to noise signals during said readout period;
   means connecting a first switch means between said first power terminal and said first point,
   means connecting said second point to said second power terminal;
   an input signal terminal, adapted to receive a memory control signal coupled to said memory array for initiating the readout of information contained in the memory array; and
   means, responsive to a signal initiating the readout of information from the memory, coupled to said first switch means for opening said switch means and electrically disconnecting said first point from said first power terminal during the readout of information from said memory into said sense circuitry.

7. The combination as claimed in claim 6 wherein said means connecting said second point to said second power terminal includes a second switch means connected between said second power terminal and said second point; and wherein said means responsive to a signal initiating the readout of information from the memory includes means coupled to said second switch means for opening said second switch means and electrically disconnecting said second power terminal from said second point during said readout of information.

8. The combination as claimed in claim 7 wherein said first and second switch means are first and second transistors of first and second conductivity type, respectively.

9. The combination as claimed in claim 8 wherein said first and second transistors are insulated-gate field-effect transistors (IGFETs); each IGFET having a conduction path and a control electrode;
  wherein the conduction path of said first IGFET is connected between said first power terminal and said first point; and
  wherein the conduction path of said second transistor is connected between said second power terminal and said second point.

10. The combination as claimed in claim 9 wherein the control electrodes of said first and second transistors are coupled to said means responsive to a signal initiating the readout of information for concurrently turning them off for a selected readout period.

11. The combination as claimed in claim 10 wherein said means coupling said input signal to said memory and said means responsive to a signal initiating the readout of information include a transition detector having input means coupled to said decoder for initiating selection of a cell to be read out.

12. The combination as claimed in claim 8 wherein said memory array includes an array of storage cells, a decoder responsive to control signals for selecting certain of said cells for readout, and a sense circuit into which the contents of the selected cells are readout.

13. In a semiconductor memory system which includes a memory array, and a power supply connected to the array for supplying operating power thereto and in which the array may be particularly susceptible to noise during the readout period of the memory operating cycle, the improvement comprising:
  storage means connected to the power supply for storing a voltage in response to the voltage produced by the power supply, which is suitable for powering the memory; and
  switch means responsive to a signal indicative of the readout period of the memory operating cycle, for disconnecting the power supply from the memory array during said readout period while the storage means is disconnected from the power supply and is connected to the memory array for supplying operating voltage to the memory array during said readout period.

14. The combination comprising:
  first and second power terminals for the application therebeween of an external operating potential;
  an electronic system having first and second points for the application therebetween of an operating potential for the system, said system having an operating cycle during which said system is particularly sensitive;
  energy storage means connected between said first and second points, said storage means capable of storing charge and maintaining a voltage at a relatively constant value across said system for a period greater than said operating cycle;
  means connecting a first switch means between said first power terminal and said first point;
  means connecting said second point to said second power terminal; and
  means, responsive to the initiation of said operating cycle coupled to said first switch means for opening said switch means and electrically disconnecting said first point from said first power terminal during said operating cycle.

15. The combination as claimed in claim 14 wherein said means connecting a first switch means between said first power terminal and said first point includes first and second switches connected in series between said first power terminal and said first point and including a second energy storage means connected at a point intermediate said first and second switches; and
  wherein said means responsive to the initiation of said operating cycle coupled to said first switch means includes means for opening said first switch when said second switch is closed and closing said first switch when said second switch is opened.

16. An electronic system powered from a power supply but electrically decoupled from that power supply comprising:
  first and second energy storage means;
  first and second selectively enabled switch means;
  means connecting said first switch means between said power supply and said first energy storage means for selectively connecting said power supply across said first energy storage means and transferring energy to the latter;
  means connecting said second switch means between said first energy storage means and said second energy storage means for selectively transferring energy from said first to said second energy storage means;
  means connecting said second storage means across said electronic system for providing the operating potential to the latter; and
  means coupled to said first and second selectively enabled switch means for, concurrently, turning-on said first switch means and turning off said second switch means and then, concurrently, turning off said first switch means and turning on said second switch means.

17. The combination as claimed in claim 16 wherein said means coupled to said first and second selectively enabled switch means includes means for cyclically operating said switches.

18. The combination as claimed in claim 17 wherein said first and second energy storage means are first and second capacitors, respectively.

19. The combination as claimed in claim 17 wherein said means for cyclically operating said switches are responsive to signals generated by said electronic system.

* * * * *